(12) United States Patent
Chen et al.

(10) Patent No.: US 9,418,981 B2
(45) Date of Patent: Aug. 16, 2016

(54) HIGH-VOLTAGE ELECTROSTATIC DISCHARGE DEVICE INCORPORATING A METAL-ON-SEMICONDUCTOR AND BIPOLAR JUNCTION STRUCTURE

(71) Applicant: MACRONIX INTERNATIONAL CO., LTD., Hsinchu (TW)

(72) Inventors: Hsin-Liang Chen, Hsinchu (TW);
Ying-Chieh Tsai, Chiayi (TW);
Wing-Chor Chan, Hsinchu (TW);
Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 72 days.

(21) Appl. No.: 14/532,545

(22) Filed: Nov. 4, 2014

(65) Prior Publication Data

US 2016/0126237 A1    May 5, 2016

(51) Int. Cl.

| | | |
|---|---|---|
| H01L 23/62 | (2006.01) | |
| H01L 27/02 | (2006.01) | |
| H01L 29/78 | (2006.01) | |
| H01L 29/735 | (2006.01) | |
| H01L 29/10 | (2006.01) | |
| H01L 29/08 | (2006.01) | |
| H01L 23/535 | (2006.01) | |

(52) U.S. Cl.
CPC .......... *H01L 27/0266* (2013.01); *H01L 23/535* (2013.01); *H01L 27/0259* (2013.01); *H01L 29/0808* (2013.01); *H01L 29/0821* (2013.01); *H01L 29/0852* (2013.01); *H01L 29/1008* (2013.01); *H01L 29/1095* (2013.01); *H01L 29/735* (2013.01); *H01L 29/7816* (2013.01)

(58) Field of Classification Search
CPC ............ H01L 27/0266; H01L 27/0259; H01L 23/535; H01L 29/735; H01L 29/7816; H01L 29/0808; H01L 29/0852; H01L 29/0821; H01L 29/1008; H01L 29/1095
See application file for complete search history.

(56) References Cited

U.S. PATENT DOCUMENTS

| | | |
|---|---|---|
| 2002/0195654 A1 | 12/2002 | Kwon |
| 2004/0238913 A1 | 12/2004 | Kwon et al. |
| 2012/0241900 A1 | 9/2012 | Chen et al. |
| 2012/0286362 A1 | 11/2012 | Chan et al. |

*Primary Examiner* — Stephen W Smoot
*Assistant Examiner* — Vicki B Booker
(74) *Attorney, Agent, or Firm* — Finnegan, Henderson, Farabow, Garrett & Dunner LLP

(57) ABSTRACT

A semiconductor device formed in a substrate, including a first region, a second region formed over the first region, a third region, a fourth region formed over the third region, and a fifth region formed over the first region and contacting the second region. The first, second, and fourth regions have a first-type conductivity, and constitute drain region, drain electrode, and source region of a metal-on-semiconductor (MOS) structure. The second region has a higher doping level than the first region. The third region has a second-type conductivity and constitutes channel and body regions of the MOS structure. The fifth region has the second-type conductivity and constitutes an emitter region of a bipolar junction (BJ) structure. The second and third regions constitute base and collector regions of the BJ structure.

18 Claims, 8 Drawing Sheets

HIGH-VOLTAGE ELECTROSTATIC DISCHARGE DEVICE INCORPORATING A METAL-ON-SEMICONDUCTOR AND BIPOLAR JUNCTION STRUCTURE

TECHNOLOGY FIELD

The disclosure relates to semiconductor devices and, more particularly, to electrostatic discharge (ESD) protection devices.

BACKGROUND

Bipolar-CMOS-DMOS (BCD, where CMOS stands for "complementary metal-on-semiconductor" and DMOS stands for "double-diffused metal-on-semiconductor") and triple well process have been widely used in high-voltage (HV) applications, such as electrostatic discharge (ESD) protection. Generally, the ESD performance of an HV ESD protection device depends on total width of gates of the device, as well as surface or lateral rules of the device. For an HV ESD protection device of smaller size, the surface-bulk ratio is larger as compared to a device of larger size, and thus the surface area of the device of smaller size has a larger impact on device performance as compared to that of the device of larger size. As a result, obtaining good ESD performance in devices having relatively small sizes is more challenging. Further, as the operation voltage of a device increases, on-chip ESD protection design also becomes more challenging.

An HV ESD protection device typically has a low on-state resistance ($R_{DS-on}$). When ESD occurs, the ESD current is more likely to concentrate near the surface or the drain of the HV protection device. This results in a higher current density and electric field at surface junction regions, and results in physical damage to these regions during an ESD event. As a result, the surface area of the HV protection device may have a larger impact on its performance as compared to a device having a larger on-state resistance, and thus surface or lateral rules play a more important role in the HV protection device.

Other characteristics of an HV protection device include, for example, a high breakdown voltage, which is always higher than an operation voltage of the HV protection device. Further, a trigger voltage ($V_{t1}$) of the HV device is often much higher than the breakdown voltage of the HV device. Therefore, during an ESD event, the device or internal circuit being protected (also referred to herein as the "protected device/circuit") may face the risk of being damaged before the HV protection device ever turns on to provide ESD protection. Conventionally, to reduce the trigger voltage of the HV protection device, an additional external ESD detection circuit may be needed.

The HV protection device usually has a low holding voltage, which may result in the HV protection device being triggered by unwanted noise, a power-on peak voltage, or a surge voltage. As a result, latch-up may occur during normal operation.

Further, there may be a field plate effect in the HV protection device. That is, an electric field distribution in the HV protection device is sensitive to routing of wirings that connect different elements or different portions of a device. As a result, the ESD current is more likely to concentrate near the surface or the drain of the HV device.

SUMMARY

In accordance with the disclosure, there is provided a semiconductor device including a substrate, a metal-on-semiconductor (MOS) structure formed in the substrate, and a bipolar junction (BJ) structure formed in the substrate. The MOS structure includes a first semiconductor region having a first-type conductivity and a first doping level, a second semiconductor region formed over the first semiconductor region, having the first-type conductivity and a second doping level higher than the first doping level, a third semiconductor region having a second-type conductivity, and a fourth semiconductor region formed over the third semiconductor region and having the first-type conductivity. The first, second, and fourth semiconductor regions are a drain region, a drain electrode, and a source region, respectively, of the MOS structure. The third semiconductor region includes a channel region and a body region of the MOS structure. The channel region is formed between the first semiconductor region and the fourth semiconductor region. The BJ structure includes a fifth semiconductor region formed over the first semiconductor region and in contact with the second semiconductor region. The fifth semiconductor region has the second-type conductivity and is an emitter region of the BJ structure. The second and third semiconductor regions are a base region and a collector region, respectively, of the BJ structure.

Also in accordance with the disclosure, there is provided a semiconductor device including a substrate, a metal-on-semiconductor (MOS) structure formed in the substrate, and a bipolar junction (BJ) structure formed in the substrate. The MOS structure includes a drain region, a drain electrode, a channel region, a body region, and a source region. The BJ structure includes an emitter region, a base region, and a collector region. The drain electrode and the base region share a first common semiconductor region in the substrate, and the body region and the collector region share a second common semiconductor region in the substrate.

Also in accordance with the disclosure, there is provided a semiconductor device including a substrate, a first well formed in the substrate, a first heavily-doped region formed in the first well, a second well formed in the substrate and near the first well, a second heavily-doped region formed in the second well, and a third heavily-doped region formed in the first well. The first well has a first-type conductivity and a first doping level. The first heavily-doped region has the first-type conductivity and a second doping level higher than the first doping level. The second well has a second-type conductivity and a third doping level. The second heavily-doped region has the first-type conductivity and a fourth doping level higher than the first doping level. The third heavily-doped region has the second-type conductivity and a fifth doping level higher than the third doping level. The third heavily-doped region is in contact with the first heavily-doped region.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Embodiments consistent with the disclosure include a high voltage electrostatic discharge (ESD) protection device.

Hereinafter, embodiments consistent with the disclosure will be described with reference to the drawings. Wherever possible, the same reference numbers will be used throughout the drawings to refer to the same or like parts.

Figure 1:
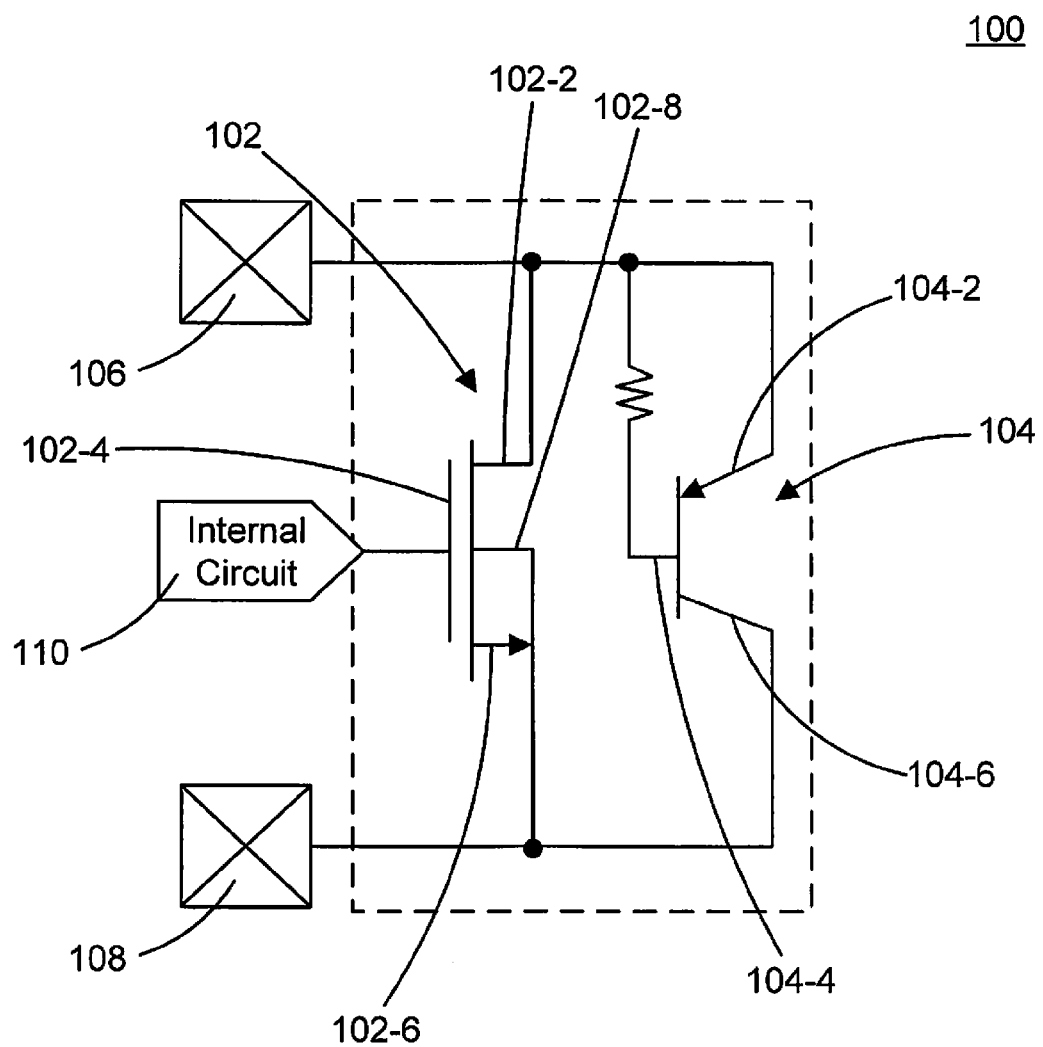
FIG. 1 shows an equivalent circuit of an electrostatic discharge (ESD) protection device according to an exemplary embodiment.

FIG. 1 shows an equivalent circuit of an exemplary high-voltage (HV) ESD protection device 100 consistent with the disclosure. The ESD protection device 100 includes a metal-on-semiconductor (MOS) structure 102 and a bipolar junction (BJ) structure 104 formed in one device. As described below, the MOS structure 102 and the BJ structure 104 are electrically coupled to each other without use of metal wiring. In the example shown in FIG. 1, the MOS structure 102 includes a high-voltage (HV) N-channel MOS (NMOS) structure, and the BJ structure 104 includes a PNP BJ (PNP BJ) structure (where "N" and "P" refer to N-type conductivity and P-type conductivity, respectively).

In the equivalent circuit shown in FIG. 1, the MOS structure 102 includes a drain 102-2, a gate 102-4, a source 102-6, and a body 102-8. The BJ structure 104 includes an emitter 104-2, a base 104-4, and a collector 104-6. The drain 102-2 of the MOS structure 102 and the emitter 104-2 of the BJ structure 104 are electrically coupled to each other and to a terminal 106 connectable to a power supply (the terminal 106 is also referred to as a "power supply terminal"). The source 102-6 of the MOS structure 102 and the collector 104-6 of the BJ structure 104 are electrically coupled to each other and to a terminal 108 connectable to a circuit ground (the terminal 108 is also referred to as a "circuit ground terminal"). The base 104-4 of the BJ structure 104 is electrically coupled to the terminal 106 through a resistor, which may be an internal resistor in a semiconductor substrate in which the MOS structure 102 and the BJ structure 104 are formed. As shown in FIG. 1, the gate 102-4 of the MOS structure 102 is electrically coupled to an internal circuit 110 protected by the ESD protection device 100.

In the equivalent circuit shown in FIG. 1, the drain 102-2 of the MOS structure 102 and the base 104-4 of the BJ structure 104 are electrically coupled to each other. As will be described later and consistent with embodiments of the disclosure, the base 104-4 of the BJ structure 104 also serves as a drain electrode of the MOS structure 102, i.e., the base 104-4 of the BJ structure 104 and the drain electrode of the MOS structure 102 physically share a common region in the ESD protection device 100. Moreover, the body 102-8 of the MOS structure 102 and the collector 104-6 of the BJ structure 104 are electrically coupled to each other. As will be described later and consistent with embodiments of the disclosure, the body 102-8 of the MOS structure 102 and the collector 104-6 of the BJ structure 104 physically share another common region in the ESD protection device 100.

Figure 2A:
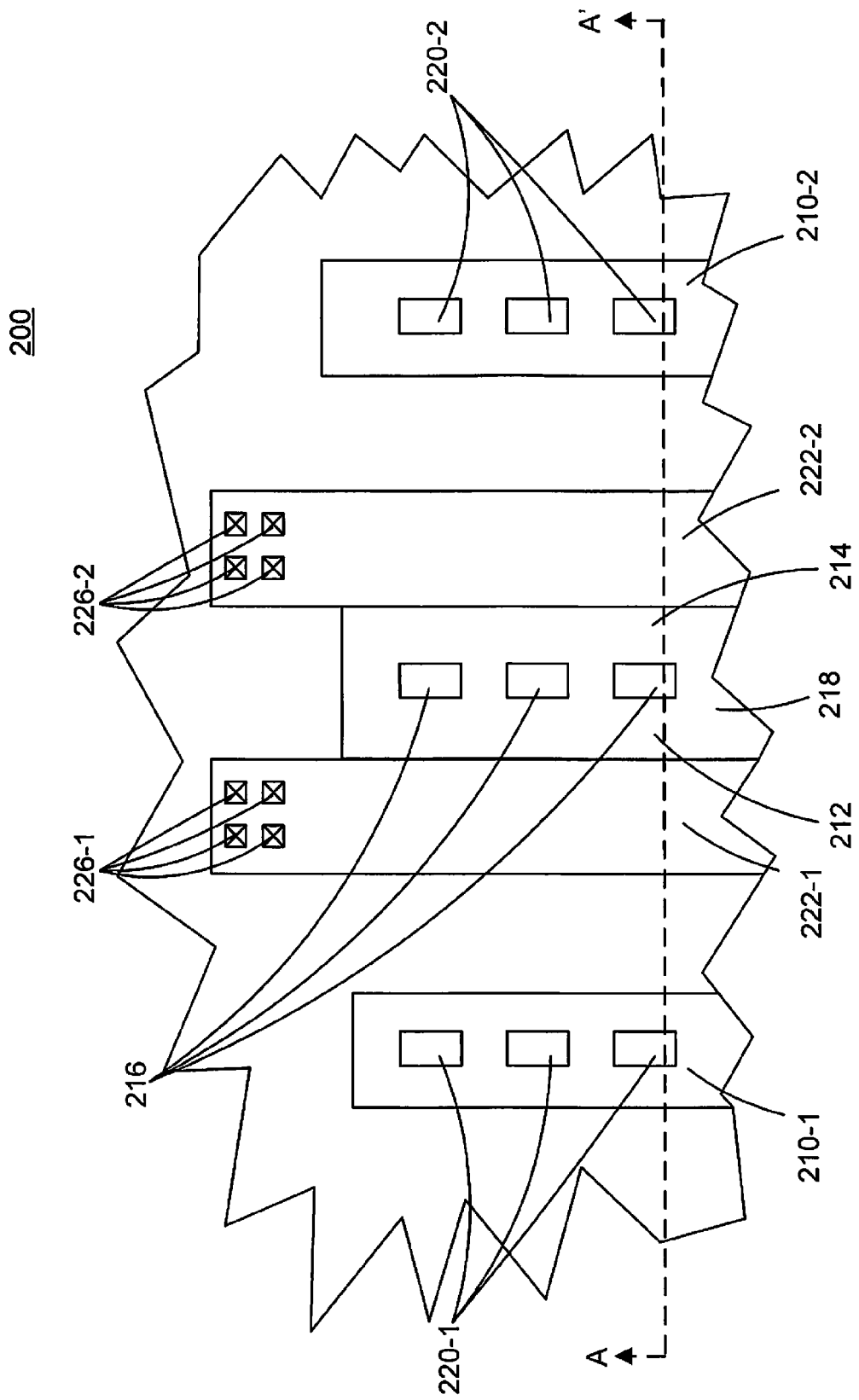
FIGS. 2A and 2B are a plan view and a cross-sectional view, respectively, schematically showing a portion of an ESD protection device according to an exemplary embodiment.
Figure 2B:
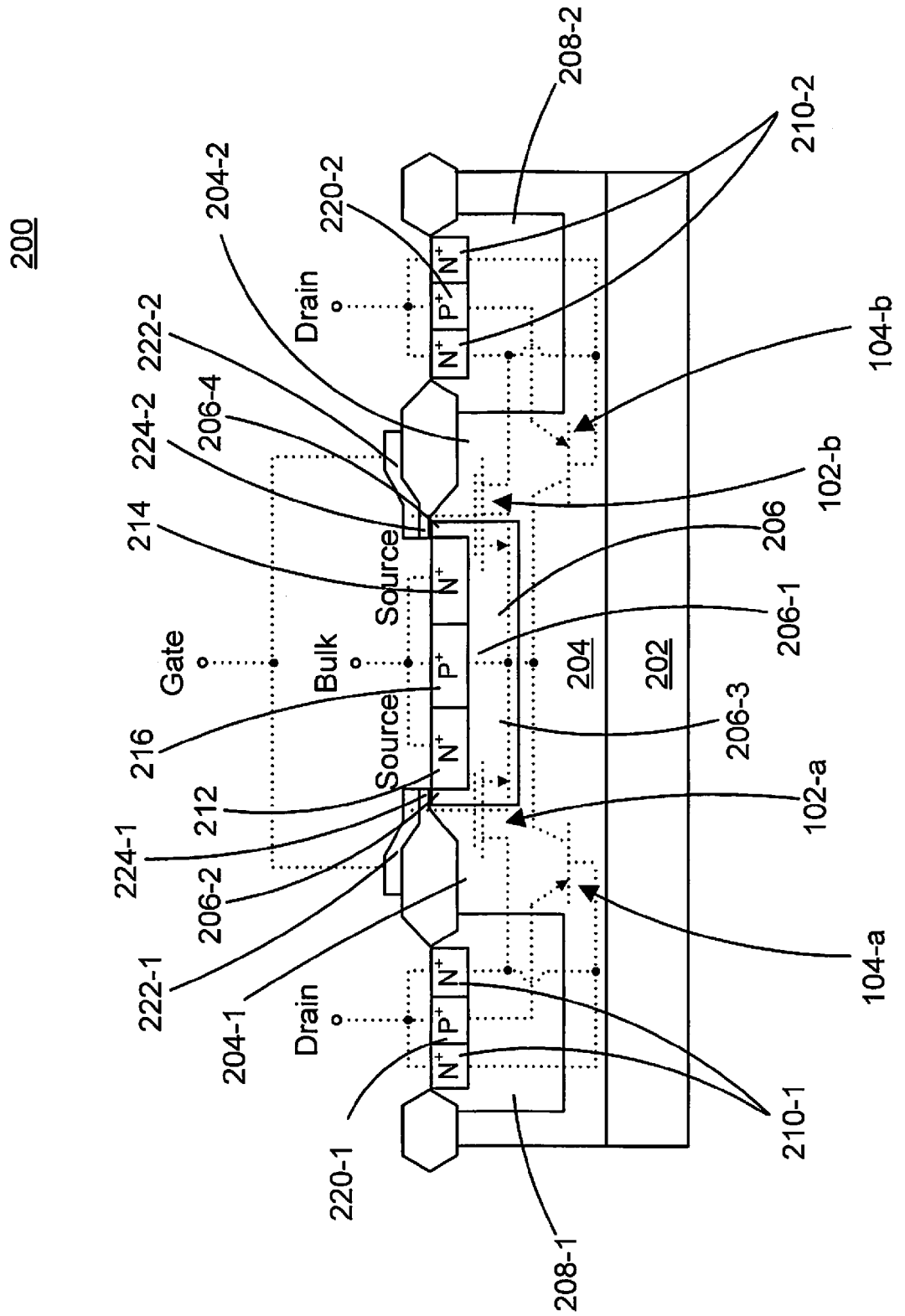

FIG. 2A is a plan view schematically showing a portion of an ESD protection device 200 consistent with embodiments of the disclosure. The ESD protection device 200 has a corresponding equivalent circuit as shown in FIG. 1. Therefore, the same numerals 102 and 104 are used to refer to the MOS structure and the BJ structure in the ESD protection device 200. FIG. 2B is a cross-sectional view of the ESD protection device 200 taken along a cut-line AA' in FIG. 2A.

Referring to FIGS. 2A and 2B, the ESD protection device 200 includes a P-type substrate 202, an HV N-type well (HV N-Well) 204 formed in the P-type substrate 202, and a P-type well (P-Well) 206 formed in the HV N-Well 204.

The ESD protection device 200 also includes a first N-Well 208-1 and a second N-Well 208-2 formed in and electrically coupled to the HV N-Well 204. The first and second N-Wells 208-1 and 208-2 are arranged approximately symmetrical to each other with respect to a middle portion 206-1 of the P-Well 206 (hereinafter also referred to as "P-Well middle portion 206-1"). A first heavily-doped N-type ($N^+$) region 210-1 and a second $N^+$ region 210-2 are formed in or above the first and second N-Wells 208-1 and 208-2, respectively. The first and second $N^+$ regions 210-1 and 210-2 are electrically coupled to the first and second N-Well 208-1 and 208-2, respectively, and are arranged approximately symmetrical to each other with respect to the P-Well middle portion 206-1.

The ESD protection device 200 further includes a third $N^+$ region 212, a fourth $N^+$ region 214, and a first heavily-doped P-type ($P^+$) region 216 formed in the P-Well 206. The third and fourth $N^+$ regions 212 and 214 are arranged approximately symmetrical to each other with respect to the P-Well middle portion 206-1. Consistent with embodiments of the disclosure, and as shown in FIG. 2A, the third and fourth $N^+$ regions 212 and 214 are parts of a continuous $N^+$ semiconductor region 218 formed in the P-Well 206. The first $P^+$ region 216 is formed in the continuous $N^+$ region 218. Consistent with the disclosure, the first $P^+$ region 216 is formed all the way through the continuous $N^+$ region 218 and is in physical and electrical contact with the P-Well 206.

As shown in FIGS. 2A and 2B, the ESD protection device 200 further includes a second $P^+$ region 220-1 and a third $P^+$ region 220-2, formed in the first and second $N^+$ regions 210-1 and 210-2, respectively, and over the first and second N-Wells 208-1 and 208-2, respectively. In some embodiments, as shown in FIG. 2B, the second and third $P^+$ regions 220-1 and 220-2 are formed all the way through the first and second $N^+$ regions 210-1 and 210-2, respectively.

In the ESD protection device 200, the P-type substrate 202 may be a P-type wafer (such as a P-type silicon wafer), a P-type layer epitaxially grown on a growth substrate, or a P-type silicon-on-insulator substrate. An impurity concentration, i.e., doping level, in the P-type substrate is about $1\times10^{10}$ $cm^{-3}$ to about $1\times10^{15}$ $cm^{-3}$. In some embodiments, the HV N-Well 204 can be formed by incorporating N-type impurities, such as antimony, arsenic, or phosphorous, into the P-type substrate 202 by, for example, ion implantation. In some embodiments, the HV N-Well 204 may be formed by epitaxially growing an N-type semiconductor layer over the P-type substrate 202. The HV N-Well 204 may also include a plurality of N-type buried layers stacked together. In some embodiments, an impurity concentration, i.e., doping level, in the HV N-Well 204 is about $1\times10^{12}$ cm$^{-3}$ to about $1\times10^{16}$ cm$^{-3}$.

The P-Well 206 may be formed by incorporating P-type impurities, such as boron, aluminum, or gallium, into the HV N-Well 204 by, for example, ion implantation. The P-Well 206 may include a plurality of P-type buried layers stacked together. In some embodiments, an impurity concentration, i.e., doping level in the P-Well 206 is about $1\times10^{12}$ cm$^{-3}$ to about $1\times10^{20}$ cm$^{-3}$.

The first and second N-Wells 208-1 and 208-2 can be formed by incorporating additional N-type impurities into the HV N-Well 204. Therefore, impurity concentrations in the first and second N-Wells 208-1 and 208-2 are higher than the impurity concentration in the HV N-Well 204. In some embodiments, the impurity concentrations in the first and second N-Wells 208-1 and 208-2 are in the range from about $1\times10^{10}$ cm$^{-3}$ to about $1\times10^{16}$ cm$^{-3}$. The first and second N$^+$ regions 210-1 and 210-2 can be formed by incorporating additional N-type impurities into the first and second N-Wells 208-1 and 208-2, respectively. In some embodiments, impurity concentrations in the first and second N$^+$ regions 210-1 and 210-2 are in the range from about $1\times10^{15}$ cm$^{-3}$ to about $1\times10^{20}$ cm$^{-3}$.

The third and fourth N$^+$ regions 212 and 214 (or the continuous N$^+$ region 218) can be formed by incorporating N-type impurities into the P-Well 206. In some embodiments, an impurity concentration in each of the third N$^+$ region 212 and the fourth N$^+$ region 214 is in the range from about $1\times10^{15}$ cm$^{-3}$ to about $1\times10^{20}$ cm$^{-3}$. In some embodiments, the N$^+$ regions 210-1, 210-2, 212, and 214 are formed in the same doping step, such as the same ion implantation step.

The first P$^+$ region 216 can be formed by incorporating P-type impurities into the continuous N$^+$ region 218. In some embodiments, the impurity concentration in the first P$^+$ region 216 is in the range from about $1\times10^{15}$ cm$^{-3}$ to about $1\times10^{20}$ cm$^{-3}$. Similarly, the second and third P$^+$ regions 220-1 and 220-2 can be formed by incorporating P-type impurities into the first and second N$^+$ regions 210-1 and 210-2, respectively. In some embodiments, impurity concentrations in the second and third P$^+$ regions 220-1 and 220-2 are in the range from about $1\times10^{15}$ cm$^{-3}$ to about $1\times10^{20}$ cm$^3$. In some embodiments, the P$^+$ regions 216, 220-1, and 220-2 are formed in the same doping step, such as the same ion implantation step.

The ESD protection device 200 also includes a first polysilicon layer 222-1 and a second polysilicon layer 222-2 formed over the P-Well 206, and a first thin oxide layer 224-1 formed between the first polysilicon layer 222-1 and the P-Well 206 and a second thin oxide layer 224-2 formed between the second polysilicon layer 222-2 and the P-Well 206.

Consistent with embodiments of the disclosure, the MOS structure 102 includes a first sub-MOS structure 102-a and a second sub-MOS structure 102-b, arranged approximately symmetrical to each other with respect to the P-Well middle portion 206-1, as schematically depicted in FIG. 2B. Similarly, the BJ structure 104 includes a first sub-BJ structure 104-a and a second sub-BJ structure 104-b, arranged approximately symmetrical to each other with respect to the P-Well middle portion 206-1. Consistent with embodiments of the disclosure, different regions described above serve as different functional components of the first and second sub-MOS structures 102-a and 102-b, and different functional components of the first and second sub-BJ structures 104-a and 104-b, as described in detail below.

The first sub-MOS structure 102-a includes the first N-Well 208-1, the first N$^+$ region 210-1, a portion of the HV N-Well 204 (hereinafter also referred to as "first HV N-Well portion 204-1") that is between the first N-Well 208-1 and the P-Well 206, a portion of the P-Well 206 (hereinafter also referred to as "first P-Well side portion 206-2") that is beneath the first oxide layer 224-1 and between the first HV N-Well portion 204-1 and the third N$^+$ region 212, another portion of the P-Well 206 (hereinafter also referred to as "P-Well bottom portion 206-3") that is connected to the first P-Well side portion 206-2, the first P$^+$ region 216, and the third N$^+$ region 212. Consistent with the disclosure, the first N-Well 208-1, the first N$^+$ region 210-1, the first HV N-Well portion 204-1, the first P-Well side portion 206-2, the P-Well bottom portion 206-3, the first P$^+$ region 216, and the third N$^+$ region 212 serve as a drain region, a drain electrode, a drift region, a channel region, a body region, a body electrode, and a source region, respectively, of the first sub-MOS structure 102-a. As understood by one of ordinary skill in the art, the drift region refers to a region in a transistor device between a drain region of the transistor and a channel region of the transistor and/or a region between a source region of the transistor and the channel region that is usually relatively more lightly doped as compared to the drain region or the source region, and helps to increase a breakdown voltage of the transistor.

Similarly, the second sub-MOS structure 102-b includes the second N-Well 208-2, the second N$^+$ region 210-2, another portion of the HV N-Well 204 (hereinafter also referred to as "second HV N-Well portion 204-2") that is between the second N-Well 208-2 and the P-Well 206, another portion of the P-Well 206 (hereinafter also referred to as "second P-Well side portion 206-4") that is beneath the second oxide layer 224-2 and between the second HV N-Well portion 204-2 and the fourth N$^+$ region 214, the P-Well bottom portion 206-3, the first P$^+$ region 216, and the fourth N$^+$ region 214. Consistent with the disclosure, the second N-Well 208-2, the second N$^+$ region 210-2, the second HV N-Well portion 204-2, the second P-Well side portion 206-4, the P-Well bottom portion 206-3, the first P$^+$ region 216, and the fourth N$^+$ region 214 serve as a drain region, a drain electrode, a drift region, a channel region, a body region, a body electrode, and a source region, respectively, of the second sub-MOS structure 102-b.

In the ESD protection device 200, first gate contacts 226-1 are formed over and electrically coupled to the first polysilicon layer 222-1, and are therefore electrically coupled to the gate electrodes of the first sub-MOS structure 102-a. Second gate contacts 226-2 are formed over and electrically coupled to the second polysilicon layer 222-2, and are therefore electrically coupled to the gate electrodes of the second sub-MOS structure 102-b. The gate contacts 226-1 and 226-2 may be electrically coupled to each other by, for example, metal wiring, and electrically coupled to the internal circuit 110 (not shown in FIGS. 2A and 2B) that is protected by the ESD protection device 200.

The first sub-BJ structure 104-a includes the second P$^+$ region 220-1, the first N$^+$ region 210-1, the P-Well 206, and the first P$^+$ region 216, which serve as an emitter region, a base region, a collector region, and a collector electrode, respectively, of the first sub-BJ structure 104-a. Similarly, the second sub-BJ structure 104-b includes the third P$^+$ region 220-2, the second N$^+$ region 210-2, the P-Well 206, and the first P$^+$ region 216, which serve as an emitter region, a base region, a collector region, and a collector electrode, respectively, of the second sub-BJ structure 104-b.

Figure 3:
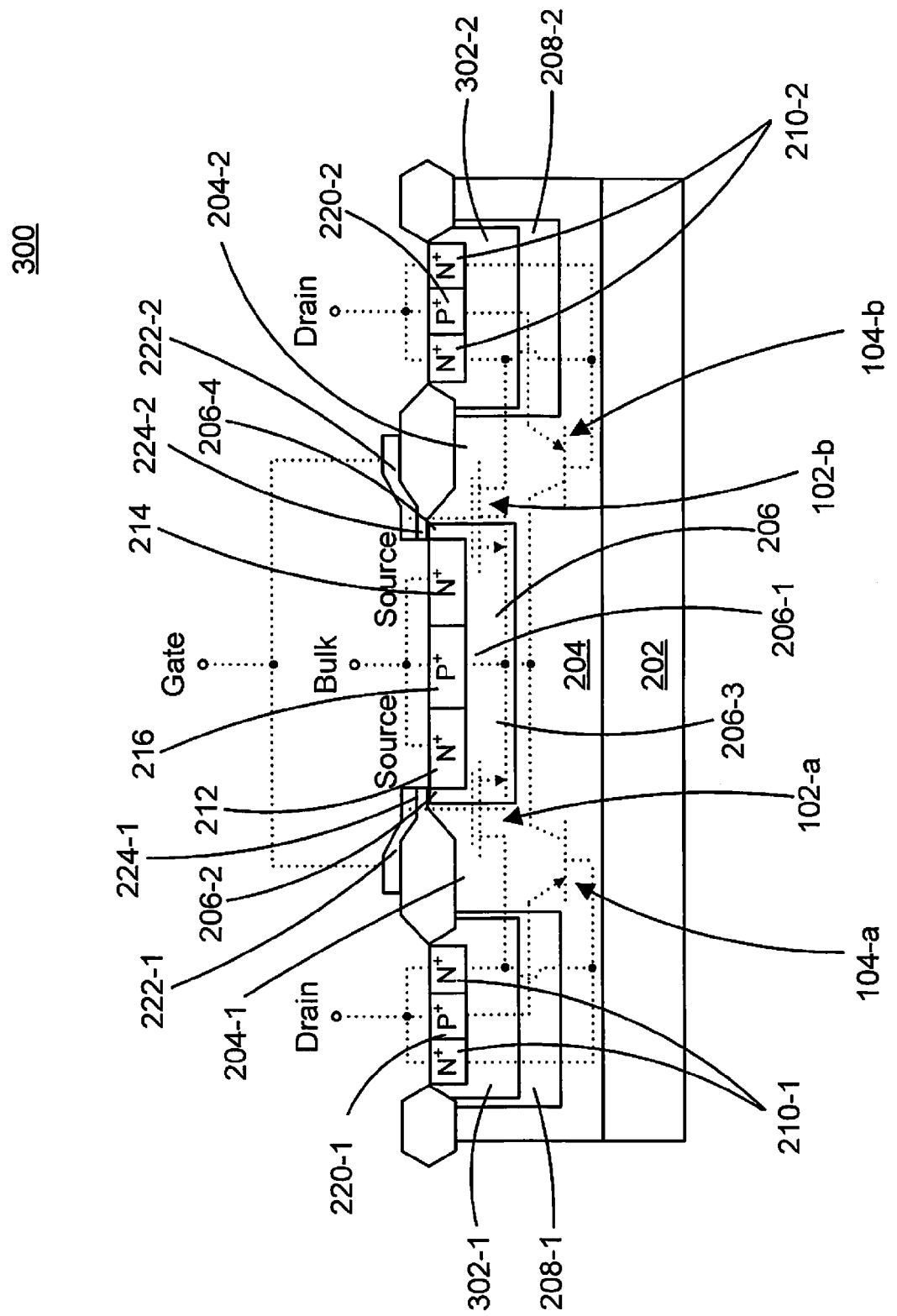
FIG. 3 is a cross-sectional view schematically showing a portion of an ESD protection device according to another exemplary embodiment.

FIG. 3 shows another ESD protection device 300 consistent with embodiments of the disclosure. The plan view of the ESD protection device 300 is the same as that of the ESD protection device 200 shown in FIG. 2A, and therefore is not repeated. FIG. 3 is a cross-sectional view of the ESD protection device 300 taken along the cut line AA' of the plan view in FIG. 2A.

The ESD protection device 300 is similar to the ESD protection device 200, except that the ESD protection device 300 further includes first and second shallow N-Wells 302-1 and 302-2. The first and second shallow N-Wells 302-1 and 302-2 may be formed by incorporating additional N-type impurities into the first and second N-Wells 208-1 and 208-2, respectively. Therefore, impurity concentrations in the first and second shallow N-Wells 302-1 and 302-2 are higher than the impurity concentrations in the first and second N-Wells 208-1 and 208-2, respectively. In this embodiment, the first and second $N^+$ regions 210-1 and 210-2 may be formed by incorporating additional N-type impurities into the first and second shallow N-Wells 302-1 and 302-2, respectively, and therefore impurity concentrations in the first and second shallow N-Wells 302-1 and 302-2 are lower than the impurity concentrations in the first and second $N^+$ regions 210-1 and 210-2, respectively. In some embodiments, the impurity concentrations in the first and second shallow N-Wells 302-1 and 302-2 are in the range from about $1 \times 10^{15}$ cm$^{-3}$ to about $1 \times 10^{20}$ cm$^{-3}$. Consistent with embodiments of the disclosure, with the additional shallow N-Wells 302-1 and 302-2, the first and second sub-BJ structures 104-a and 104-b shown in FIG. 3 can be more easily turned on as compared to the first and second sub-BJ structures 104-a and 104-b shown in FIG. 2B.

Figure 4:
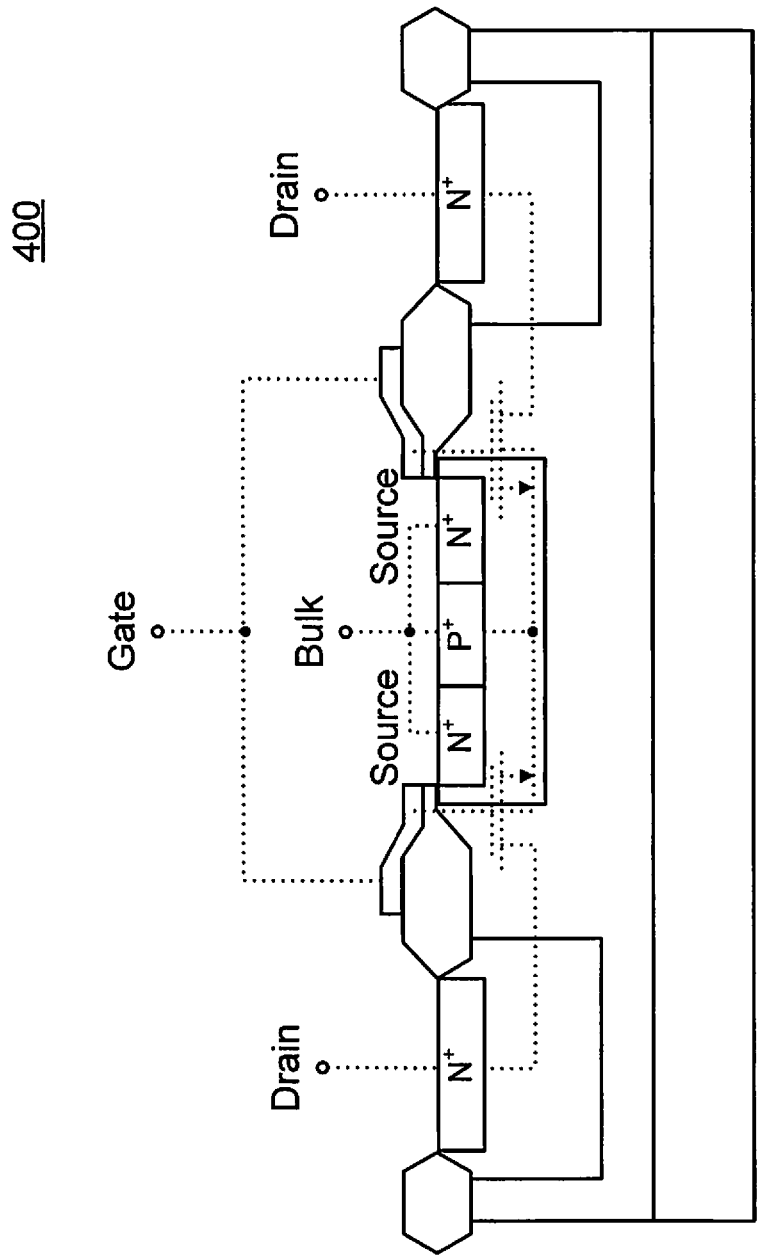
FIG. 4 is a cross-sectional view schematically showing a portion of a conventional ESD protection device.

As discussed above, compared to a conventional device (such as a conventional ESD protection device 400 shown in FIG. 4), a device consistent with embodiments of the disclosure (hereinafter also referred to as a "novel ESD protection device"), such as the ESD protection device 200 shown in FIGS. 2A and 2B or the ESD protection device 300 shown in FIG. 3, has a built-in BJ structure in addition to an HV MOS structure. In contrast, as shown in FIG. 4, the conventional ESD protection device 400 does not have a built-in BJ structure. As such, in a novel ESD protection device consistent with the disclosed embodiments, since the MOS structure and the BJ structure share portions of the same substrate area, the total substrate area required by the novel ESD protection device is nearly the same as by the conventional ESD protection device 400 having only an HV MOS structure. During the operation of the novel ESD protection device, the MOS structure and the BJ structure turn on at the same time, and thus ESD current passes through both the MOS structure and the BJ structure. During an ESD event, the ESD current can also flow through the deeper path of the BJ structure. Therefore, the novel ESD protection device has a lower turn-on resistance and an improved safe operating area (SOA). For example, compared to the conventional ESD protection device 400, the turn-on resistance of the novel ESD protection device can be reduced by about 14% to about 18%, and the SOA of the novel ESD protection device can be improved by about 23% to about 32%.

Comparisons between electrical characteristics of the conventional ESD protection device 400 and electrical characteristics of the ESD protection devices 200 and 300, are shown in FIGS. 5A, 5B, 6A, 6B, and 7.

Figure 5A:
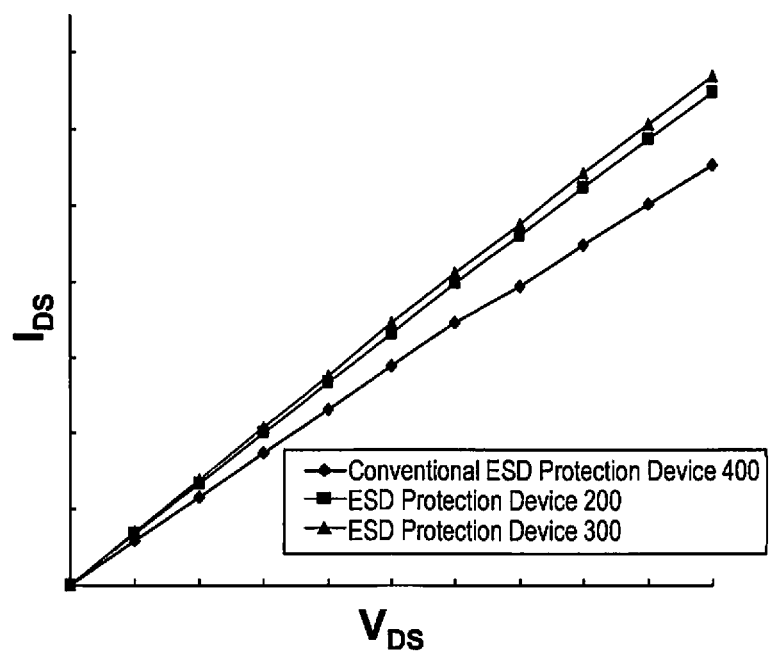
FIGS. 5A and 5B show measured current-voltage curves of a conventional ESD protection device and ESD protection devices consistent with embodiments of the disclosure.
Figure 5B:
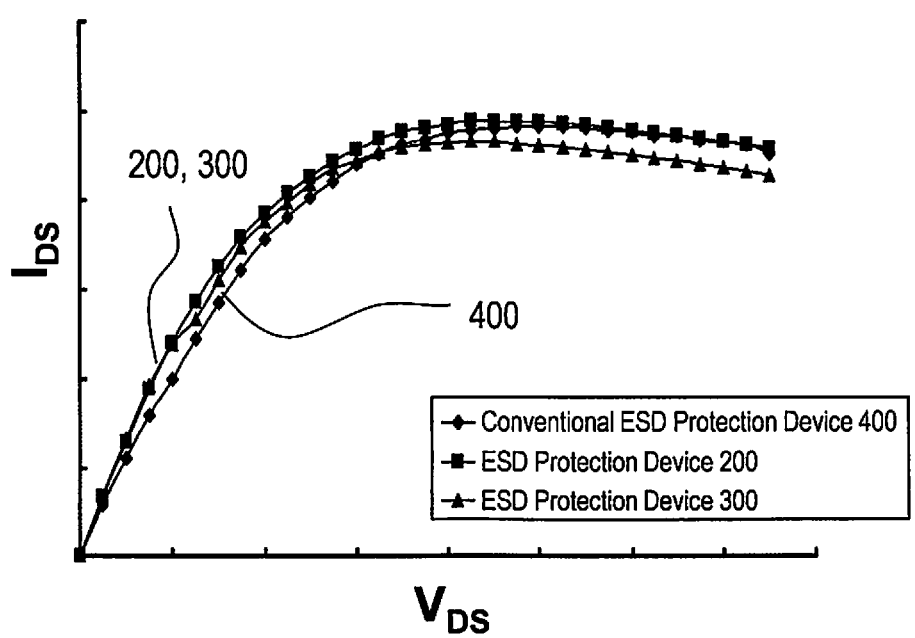

Specifically, FIGS. 5A and 5B show actually-measured $I_{DS}$-$V_{DS}$ curves (where "$I_{DS}$" refers to drain current and "$V_{DS}$" refers to drain voltage) of the conventional ESD protection device 400 and the ESD protection devices 200 and 300. FIG. 5A shows the linear regions of the $I_{DS}$-$V_{DS}$ curves, while FIG. 5B shows both the linear regions and the saturation regions of the $I_{DS}$-$V_{DS}$ curves. As seen from FIG. 5A, in the linear regions, at the same $V_{DS}$, the $I_{DS}$ of the ESD protection devices 200 and 300 is larger than the $I_{DS}$ of the conventional ESD protection device 400. Further, when $V_{DS}$ increases, the $I_{DS}$ of the ESD protection devices 200 and 300 increases faster as compared to the $I_{DS}$ of the conventional ESD protection device 400. This means that an on-state resistance, $R_{DS-on}$, of the ESD protection devices 200 and 300 is smaller than $R_{DS-on}$ of the conventional ESD protection device 400. Moreover, as seen in FIG. 5B, when the devices enter into the saturation region, the $I_{DS}$ of the ESD protection devices 200 and 300 is higher than the $I_{DS}$ of the conventional ESD protection device 400. That is, a saturation current, $I_{DS-sat}$, of the ESD protection devices 200 and 300 is higher than $I_{DS-sat}$ of the conventional ESD protection device 400. In summary, as shown in FIGS. 5A and 5B, the ESD protection devices 200 and 300 can handle larger current when an ESD event occurs, as compared to the conventional ESD protection device 400.

Figure 6A:
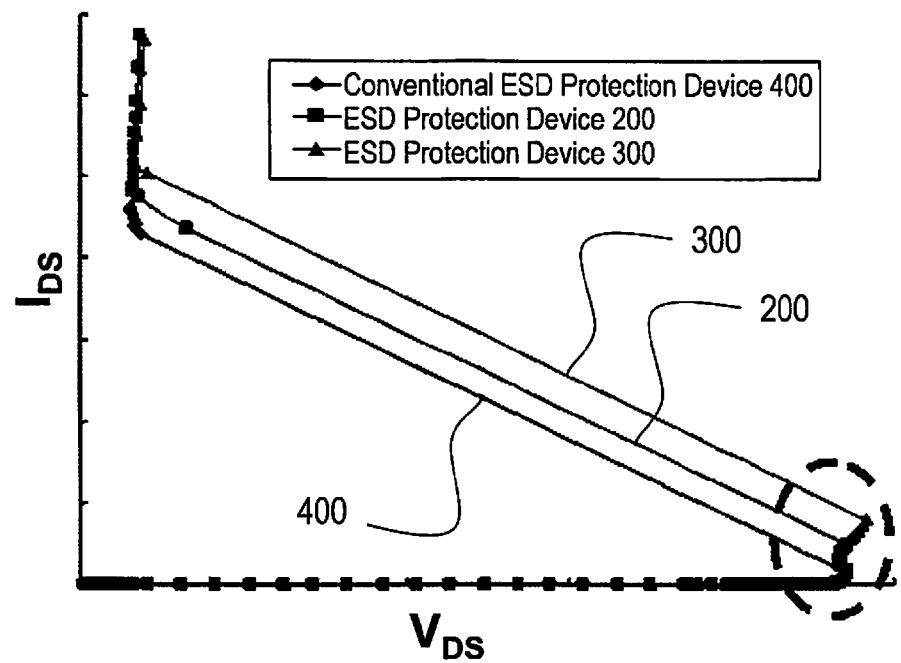
FIGS. 6A and 6B show measured transmission line pulse curves of the conventional ESD protection device and the ESD protection devices consistent with embodiments of the disclosure.
Figure 6B:
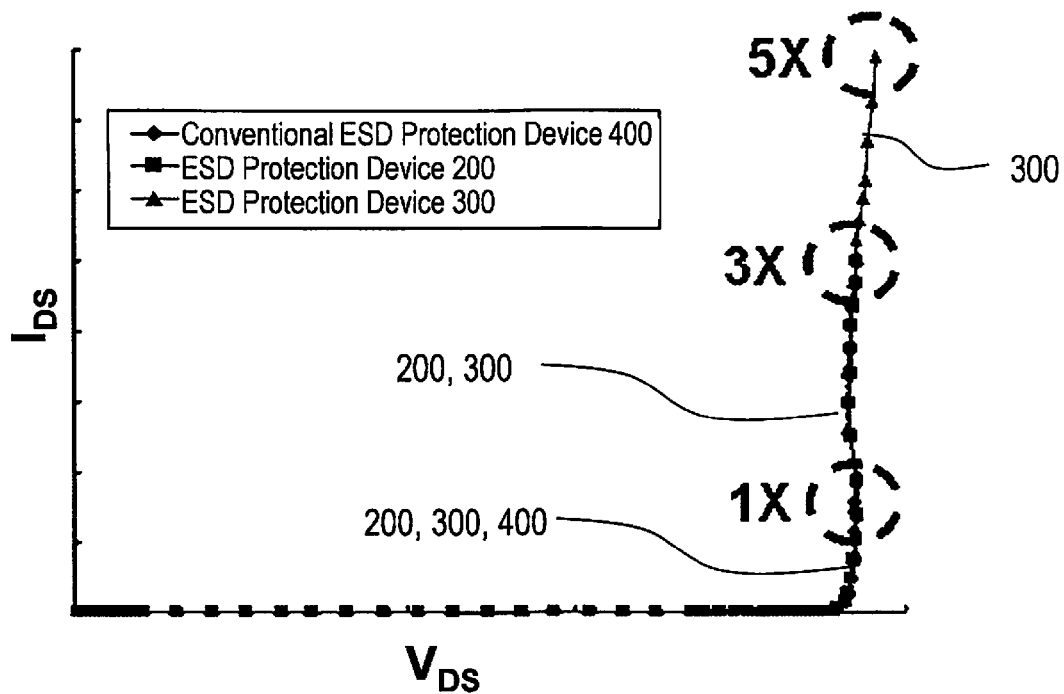

Transmission line pulse (TLP) testing was performed to evaluate the ESD protection performance of the ESD protection devices 200 and 300, and that of the conventional ESD protection device 400. FIG. 6A shows a TLP curve of the conventional ESD protection device 400 and TLP curves of the ESD protection devices 200 and 300. FIG. 6B is an enlarged view of the TLP curves, showing details of the portions where snapback occurs, i.e., where the devices are triggered to turn on (the circled region in FIG. 6A). In FIGS. 6A and 6B, the horizontal axis represents $V_{DS}$ and the vertical axis represents $I_{DS}$. As seen in FIGS. 6A and 6B, when snapback occurs, the $I_{DS}$ of each of the ESD protection devices 200 and 300 is higher than that of the conventional ESD protection device 400. That is, each of the ESD protection devices 200 and 300 has a higher trigger current than the conventional ESD protection device 400. Specifically, the trigger current of the ESD protection device 200 is about three times higher than the conventional ESD protection device 400, and that of the ESD protection device 300 is about five times higher than the conventional ESD protection device 400. In view of the higher trigger current, latch-up is less likely to occur in the ESD protection devices 200 and 300 as compared to the conventional ESD protection device 400.

Figure 7:
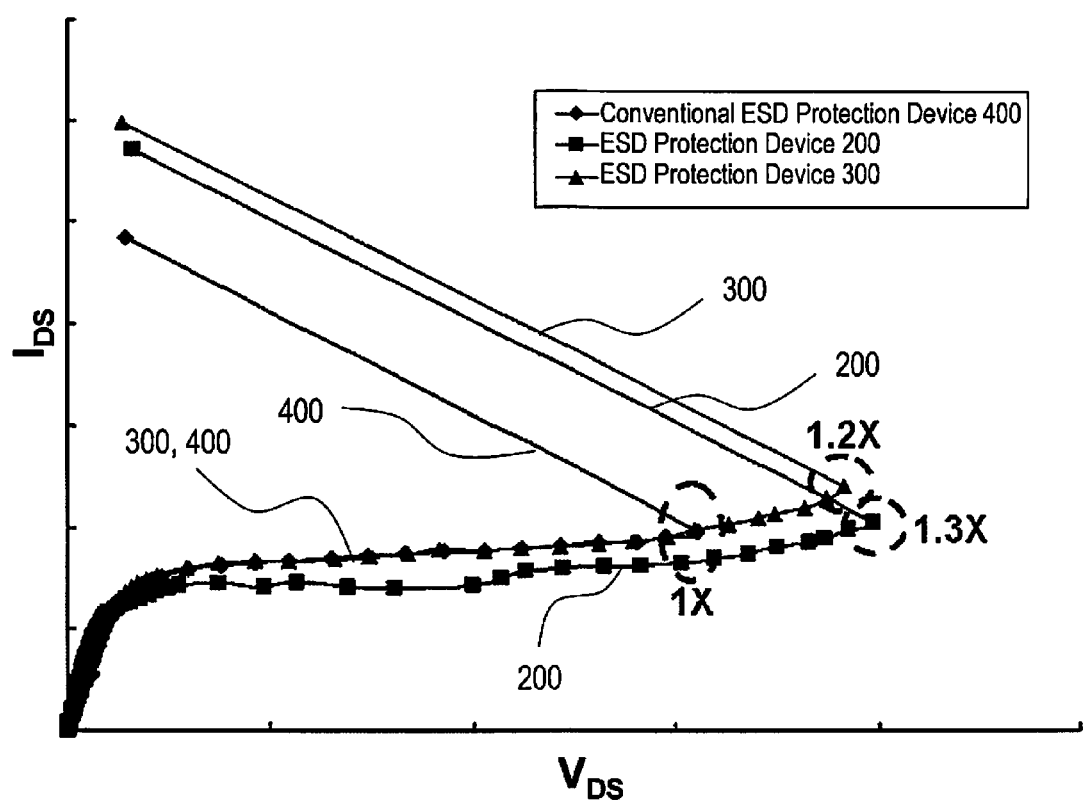
FIG. 7 shows measured electrical safe-operating area curves of the conventional ESD protection device and the ESD protection devices consistent with embodiments of the disclosure.

FIG. 7 shows the electrical safe-operating area (ESOA) measurement results for the conventional ESD protection device 400 and the ESD protection devices 200 and 300. The ESOA of a device determines a current-voltage boundary in which the device can safely switch, that is, the device may burn out, i.e., be damaged, if a $V_{DS}$ applied to the device exceeds the ESOA. Therefore, a device having a larger ESOA can operate safely at a higher applied voltage. Usually, the ESOA of a device can be measured in a manner similar to the TLP test but with a fixed voltage applied to a gate of the device (such as a zero voltage applied to the gate). As shown in FIG. 7, each of the ESD protection devices 200 and 300 has a larger ESOA than the conventional ESD protection device 400. Specifically, the ESOA of the ESD protection device 200 is about 1.3 times of the ESOA of the conventional ESD protection device 400, and the ESOA of the ESD protection device 300 is about 1.2 times of the ESOA of the conventional ESD protection device 400.

Table I below summarizes the improvements of the ESD protection devices 200 and 300 over the conventional ESD protection device 400. A percentage in the table means a change by that percentage, while "times" means how many times a certain property of one of the ESD protection devices 200 and 300 is that property of the conventional ESD protection device 400. For example, as shown in Table I, the trigger current of the ESD protection device 200 is about three times the trigger current of the conventional ESD protection device 400. The improvements in $R_{DS-on}$, trigger current, and ESOA are also shown in FIGS. 5A-7. The ESD improvement refers to an improvement of the capability to provide ESD protection, i.e., an improvement of the capability to handle higher ESD voltage or larger ESD current. The ESD protection capability can be measured by simulating a discharge from a human body (human-body model, HBM), a machine (machine model, MM), or a charged device (charged-device model, CDM), or using an ESD gun.

TABLE I

Comparison between Conventional and Novel ESD Protection Devices

|  | ESD Protection Device 200 | ESD Protection Device 300 |
| --- | --- | --- |
| $R_{DS-on}$ Reduction | ~14.66% | ~17.59% |
| Trigger Current Improvement | ~3 times | ~5 times |
| ESOA Improvement | ~1.3 times | ~1.2 times |
| ESD Improvement | ~2.9 times | ~2.6 times |

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:
a substrate;
a metal-on-semiconductor (MOS) structure formed in the substrate, the MOS structure including:
a first semiconductor region having a first-type conductivity and a first doping level, the first semiconductor region being a drain region of the MOS structure;
a second semiconductor region formed over the first semiconductor region, the second semiconductor region having the first-type conductivity and a second doping level higher than the first doping level, the second semiconductor region being a drain electrode of the MOS structure and conductively coupled to the drain region of the MOS structure;
a third semiconductor region having a second-type conductivity, the third semiconductor region including a channel region and a body region of the MOS structure; and
a fourth semiconductor region formed over the third semiconductor region and having the first-type conductivity, the fourth semiconductor region being a source region of the MOS structure,
wherein the channel region is formed between the first semiconductor region and the fourth semiconductor region; and
a bipolar junction (BJ) structure formed in the substrate, the BJ structure including:
a fifth semiconductor region formed over the first semiconductor region and in contact with the second semiconductor region, the fifth semiconductor region having the second-type conductivity and being an emitter region of the BJ structure,
wherein:
the second semiconductor region is a base region of the BJ structure, and
the third semiconductor region is a collector region of the BJ structure.

2. The semiconductor device according to claim 1, further comprising:
a drift region of the MOS structure formed in the substrate and between the first and third semiconductor regions, the drift region having the first-type conductivity and a doping level lower than the first doping level.

3. The semiconductor device according to claim 1, wherein the fifth semiconductor region has a doping level higher than a doping level of the third semiconductor region.

4. The semiconductor device according to claim 1, further comprising:
an electrode region formed over the third semiconductor region,
wherein the electrode region:
has the second-type conductivity and a doping level higher than a doping level of the third semiconductor region, and
is a body electrode of the MOS structure and a collector electrode of the BJ structure.

5. The semiconductor device according to claim 4, wherein the electrode region is in contact with the third semiconductor region.

6. The semiconductor device according to claim 4, wherein the electrode region and the fourth semiconductor region are electrically coupled to each other by an electrical wiring.

7. The semiconductor device according to claim 1, wherein the fifth semiconductor region is in contact with the first semiconductor region and is surrounded by the second semiconductor region in directions parallel to a surface of the semiconductor device.

8. The semiconductor device according to claim 1, wherein:
the first-type conductivity is an N-type conductivity, and
the second-type conductivity is a P-type conductivity.

9. The semiconductor device according to claim 8,
wherein the substrate is a P-type substrate,
the semiconductor device further comprising:
an N-type well (N-Well) formed in the P-type substrate, the N-Well having a doping level lower than the first doping level,
wherein the MOS structure and the BJ structure are formed in the N-Well.

10. The semiconductor device according to claim 9, wherein the N-Well includes a drift region of the MOS structure, the drift region being formed between the first and third semiconductor regions.

11. The semiconductor device according to claim 9, wherein the doping level of the N-Well is about $1\times10^{10}$ cm$^{-3}$ to about $1\times10^{16}$ cm$^{-3}$.

12. The semiconductor device according to claim 8,
wherein the first semiconductor region includes a first N-type well (N-Well),
the semiconductor device further comprising:
a second N-Well formed in the first N-Well, the second N-Well having a doping level higher than the first doping level and lower than the second doping level,
wherein the second and fifth semiconductor regions are formed in the second N-Well.

13. The semiconductor device according to claim 1, further comprising:
a gate dielectric film formed over the channel region of the MOS structure; and
a gate electrode formed over the gate dielectric film.

14. The semiconductor device according to claim 1, wherein:
the MOS structure is a first MOS structure, and
the BJ structure is a first BJ structure, the semiconductor device further including:
  a second MOS structure formed in the substrate, the second MOS structure including:
    a sixth semiconductor region arranged approximately symmetrical to the first semiconductor region with respect to a middle portion of the third semiconductor region, the sixth semiconductor region having the first-type conductivity and a third doping level, and being a drain region of the second MOS structure;
    a seventh semiconductor region formed over the sixth semiconductor region and arranged approximately symmetrical to the second semiconductor region with respect to the middle portion of the third semiconductor region, the seventh semiconductor region having the first-type conductivity and a fourth doping level higher than the third doping level, and being a drain electrode of the second MOS structure and conductively coupled to the drain region of the second MOS structure; and
    an eighth semiconductor region formed over the third semiconductor region and arranged approximately symmetrical to the fourth semiconductor region with respect to the middle portion of the third semiconductor region, the eighth semiconductor region having the first-type conductivity and being a source region of the second MOS structure,
    wherein the third semiconductor region further includes a channel region and a body region of the second MOS structure, the channel region of the second MOS structure being arranged approximately symmetrical to the channel region of the first MOS structure with respect to the middle portion of the third semiconductor region; and
  a second BJ structure formed in the substrate, the second BJ structure including:
    a ninth semiconductor region formed over the sixth semiconductor region and in contact with the seventh semiconductor region, and arranged approximately symmetrical to the fifth semiconductor region with respect to the middle portion of the third semiconductor region, the ninth semiconductor region having the second-type conductivity and being an emitter region of the second BJ structure,
    wherein:
      the seventh semiconductor region is a base region of the second BJ structure, and
      the third semiconductor region is a collector region of the second BJ structure.

15. The semiconductor device according to claim 14, wherein:
  the first doping level approximately equals the third doping level, and
  the second doping level approximately equals the fourth doping level.

16. The semiconductor device according to claim 14, wherein the fourth and eighth semiconductor regions are parts of a continuous semiconductor region having the first-type conductivity and formed over the third semiconductor region.

17. The semiconductor device according to claim 16, further comprising:
  an electrode region formed over the third semiconductor region,
  wherein the electrode region:
    has the second-type conductivity and a doping level higher than a doping level of the third semiconductor region,
    is surrounded by the continuous semiconductor region in directions parallel to a surface of the semiconductor device, and
    is a body electrode of the MOS structure and a collector electrode of the BJ structure.

18. The semiconductor device according to claim 17, wherein the electrode region is in contact with the third semiconductor region.

* * * * *